United States Patent
Bashaw et al.

[11] Patent Number: 5,877,873
[45] Date of Patent: Mar. 2, 1999

[54] DIFFERENTIAL VIDEO IMAGE COMPRESSION IN HOLOGRAPHIC MEDIA

[76] Inventors: Matthew C. Bashaw, 1023 Sevier Ave., Menlo Park, Calif. 94025; John F. Heanue, 1401 Red Hawk Cir. N211, Fremont, Calif. 94538; Lambertus Hesselink, 31 Morse La., Woodside, Calif. 94062

[21] Appl. No.: 685,623

[22] Filed: Jul. 24, 1996

[51] Int. Cl.⁶ ............... G03H 1/10; G03H 1/28; G11C 13/04
[52] U.S. Cl. ............... 359/10; 359/24; 365/125
[58] Field of Search ............... 359/10, 11, 21, 359/22, 24, 3, 4, 7; 369/103; 365/125; 382/236, 281

[56] References Cited

U.S. PATENT DOCUMENTS

| | | | |
|---|---|---|---|
| 3,612,641 | 10/1971 | Eaglesfield | 359/21 |
| 4,018,503 | 4/1977 | Silverman et al. | 359/11 |
| 4,024,513 | 5/1977 | Huignard et al. | 359/21 |
| 4,138,189 | 2/1979 | Long et al. | 339/117 |
| 5,216,527 | 6/1993 | Sharnoff et al. | 359/10 |
| 5,231,397 | 7/1993 | Ridkosil | 341/155 |
| 5,416,616 | 5/1995 | Jenkins et al. | 359/10 |
| 5,422,873 | 6/1995 | Horie et al. | 356/445 |
| 5,436,867 | 7/1995 | Mok | 365/125 |
| 5,450,218 | 9/1995 | Heanue et al. | 359/21 |
| 5,648,856 | 7/1997 | Stoll | 359/7 |

*Primary Examiner*—Jon Henry
*Attorney, Agent, or Firm*—Lumen Intellectual Property Services

[57] ABSTRACT

A video image F[k] is identified as a basis image and stored as a basis page S[k] in a holographic storage medium. A subsequent image F[k+n] is stored by recording in the medium a page $S[k+n]=F[k+n]-a[k]F[k]$, where $a[k]\neq 0$ and preferably $a[k]=1$. The page S[k] is recorded with a reference beam R[k], while S[k+n] is recorded with a reference beam R[k+n] orthogonal to R[k]. The basis page is reset whenever the average intensity of a page to be stored exceeds a predetermined threshold. An image F'[k] is retrieved by reading basis page S[k] and letting F'[k]=S[k]. Subsequent images F'[k+n] are retrieved as S[k+n]+b[k]S[k], where $b[k]\neq 0$ and preferably $b[k]=a[k]=1$. The page addition step is performed coherently, i.e. by accessing the medium with a reference wave function R[k+n]+b[k]R[k]. The coherent addition is achieved by using a compound phase-and-amplitude modulator in a phase-code-multiplexed system, and by simultaneously accessing the storage medium at two different angles in an angle-multiplexed system. Differential video compression leads to a reduction in interpage crosstalk and to a capacity increase in crosstalk-limited memories. Optical page-by-page addition allows fast readout and eliminates the need for a time-consuming electronic decompression step.

29 Claims, 6 Drawing Sheets

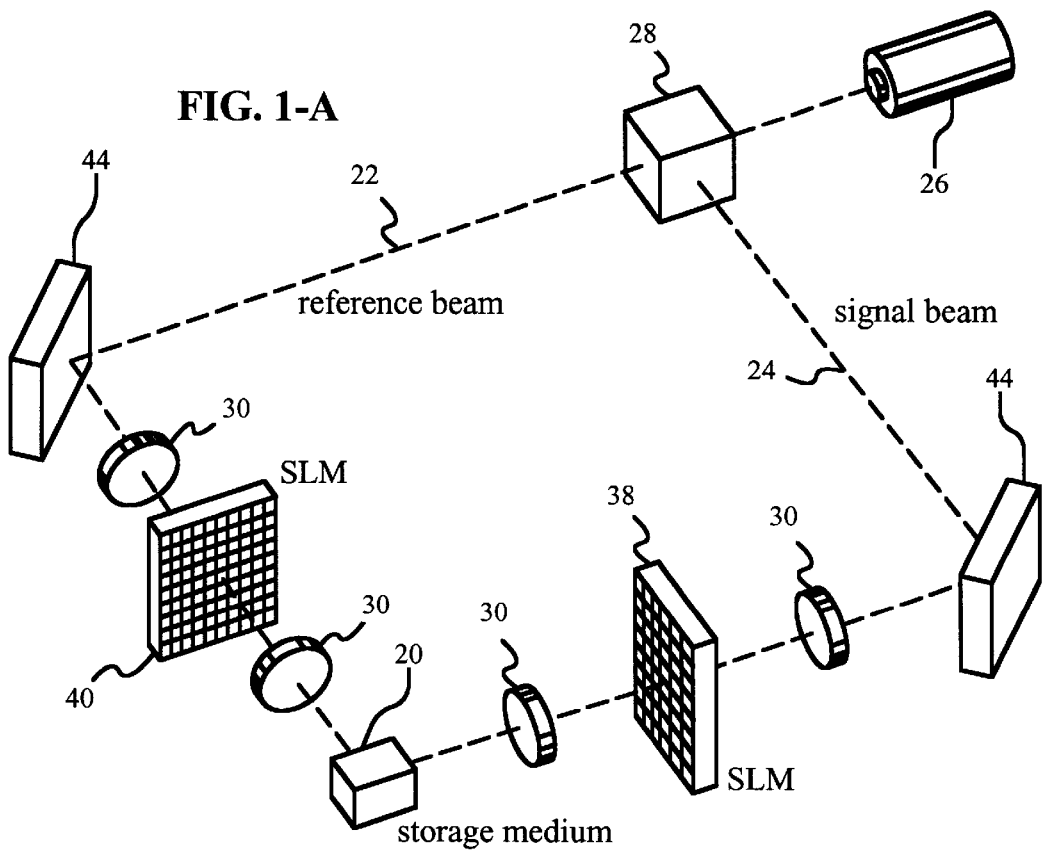
FIG. 1-A
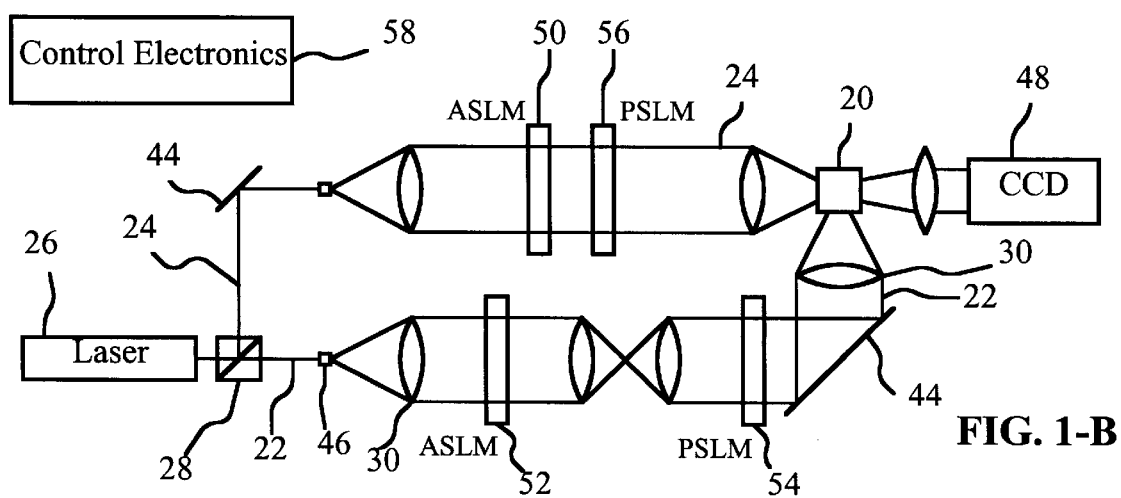
FIG. 1-B

FIG. 2-A
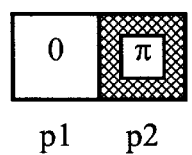
FIG. 2-B
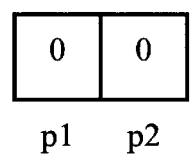
FIG. 3-A
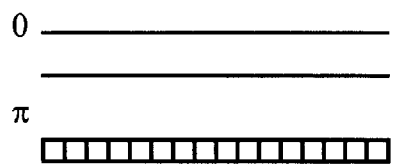
FIG. 3-B
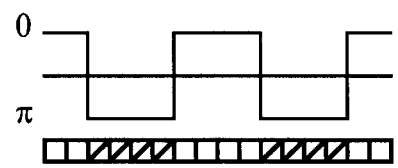
FIG. 3-C
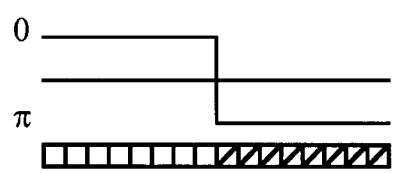
FIG. 3-D
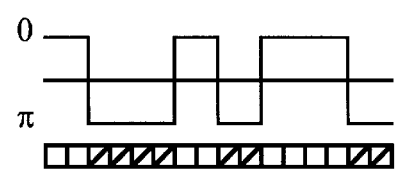
FIG. 3-E
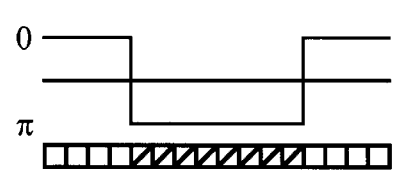
FIG. 3-F
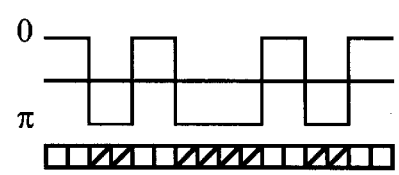
FIG. 3-G
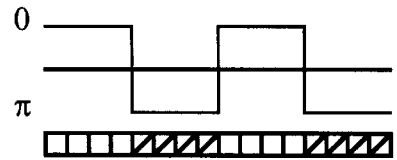
FIG. 3-H
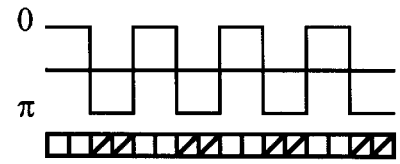

FIG. 4
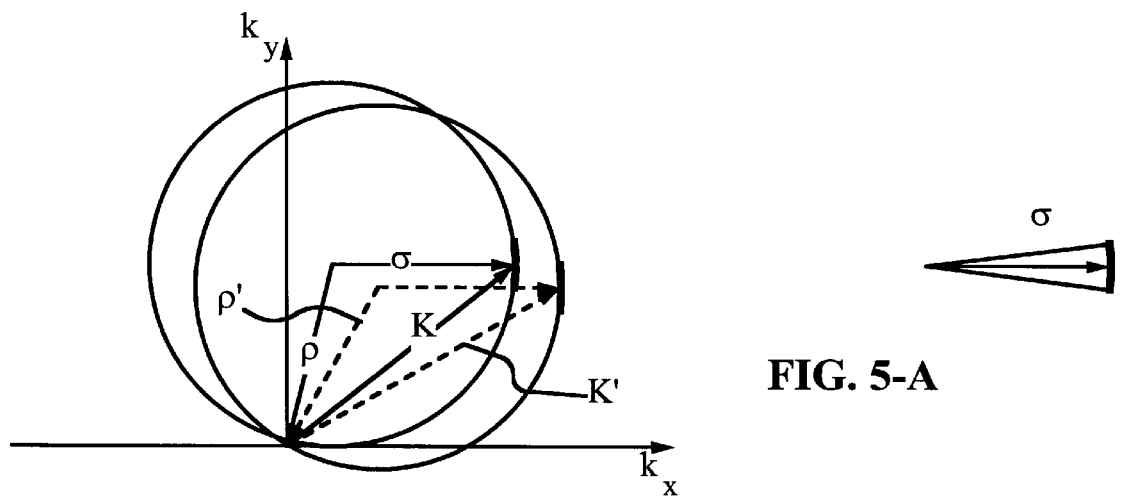
FIG. 5-A
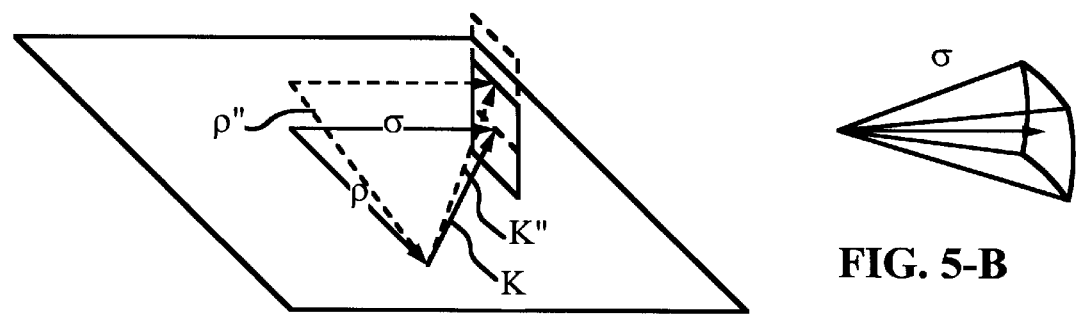
FIG. 5-B

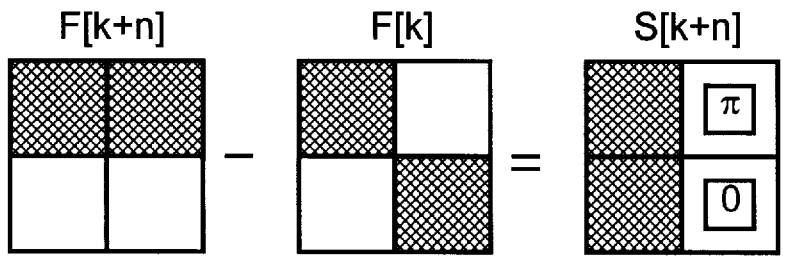
FIG. 6-A
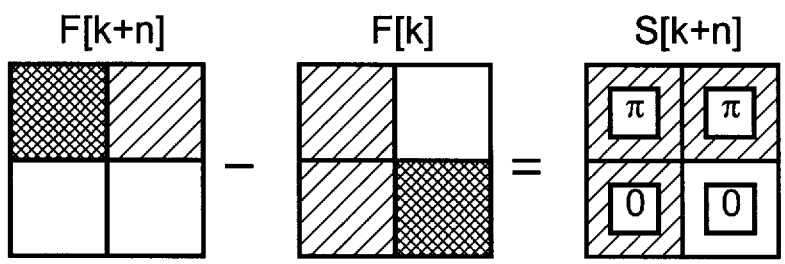
FIG. 6-B
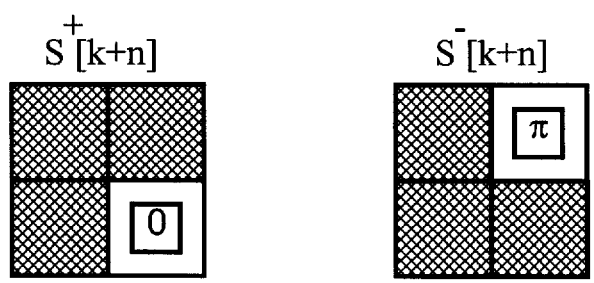
FIG. 6-C
FIG. 8

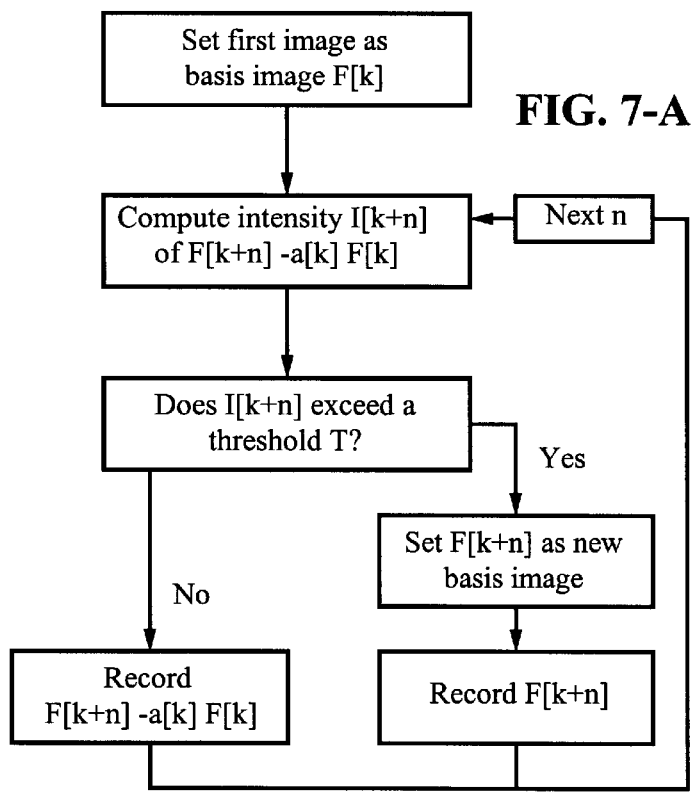
FIG. 7-A
FIG. 7-B
| Image | Recorded Page |
|---|---|
| $\|1\rangle$ | $\|1\rangle$ |
| $\|2\rangle$ | $\|2\rangle - \|1\rangle$ |
| $\|3\rangle$ | $\|3\rangle - \|1\rangle$ |
| $\|4\rangle$ | $\|4\rangle$ |
| $\|5\rangle$ | $\|5\rangle - \|4\rangle$ |
| $\|6\rangle$ | $\|6\rangle - \|4\rangle$ |
| ⋮ | ⋮ |
FIG. 9
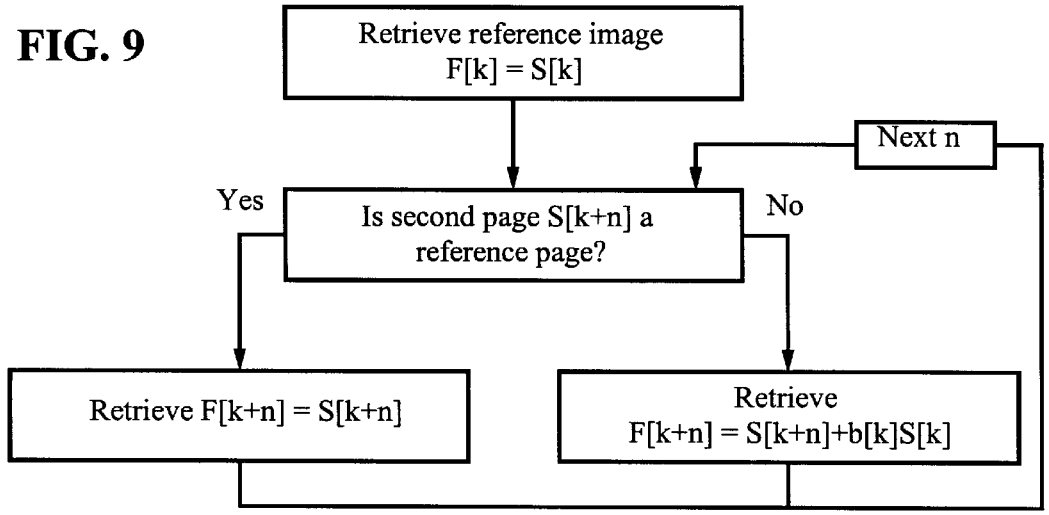

DIFFERENTIAL VIDEO IMAGE COMPRESSION IN HOLOGRAPHIC MEDIA

This invention was made with government support under Contract No. N000014-92-J-1903, awarded by ARPA. The Government has certain rights in this invention.

RELATED APPLICATION DATA

This invention is related to application Ser. No. 08/643,115, filed Apr. 30, 1996, entitled "Encrypted Holographic Data Storage Based on Orthogonal Phase Code Multiplexing," which is commonly assigned with the present invention and is herein incorporated by reference.

FIELD OF THE INVENTION

The present invention relates to the field of holographic storage, and in particular to a method of differential video image compression.

BACKGROUND OF THE INVENTION

Since the development of off-axis holography in the 1960's, volume holography has been identified as a promising candidate for high density data storage. Theoretically, up to $10^{14}$ bits of information can be stored in 1 cm$^3$ of a volume holographic medium. In addition, holographic storage promises fast data transfer rates, estimated at over 1 Gb/s. For general information on holographic memory systems, see for example the articles by Heanue et al. in *Science* 265: 749–752 (1994), Hong et al. in *Optical Engineering* 34(8): 2193–2203 (1995), and Psaltis and Mok in *Scientific American* 273(5): 70–78 (1995), or U.S. Pat. No. 4,927,220 (Hesselink et al.) and U.S. Pat. No. 5,450,218 (Heanue et al.).

One of the major challenges facing holographic data storage has been increasing the capacity of storage systems. Several approaches have been used for multiplexing, or storage of multiple pages within a system. Typical approaches include spatial, angular and phase-code multiplexing. For an overview of these techniques, see for example the above-mentioned article by Hong et al.

Three major noise sources affect the performance of typical holographic storage systems. Imperfections in detectors cause detector noise. Imperfections in the medium structure cause undesired scatter, which is independent on the number of pages stored in the system. Interpage crosstalk leads to a reconstruction of undesired pages when the medium is accessed with a reference beam corresponding to a given page. The crosstalk-limited SNR (object signal intensity/crosstalk intensity) varies inversely with the number of stored pages, for a fixed average intensity per page. For a review of interpage crosstalk for angular and phase-code multiplexing see for example the article by Bashaw et al. in *J. Opt. Soc. Am. B*, 11: 1820–1836 (1994), herein incorporated by reference. Interpage crosstalk is an important barrier facing efforts to increase the capacity of holographic storage media.

OBJECTS AND ADVANTAGES OF THE INVENTION

In light of the above, it is a primary object of the present invention to provide a method of increasing the effective capacity of crosstalk-limited holographic storage devices for storing video images. It is another object of the present invention to provide a method of encoding data in a video holographic storage system that leads to reduced interpage crosstalk. It is yet another object of this invention to provide compression and decompression methods allowing fast optical decoding of stored pages. These and other objects and advantages will become more apparent after consideration of the ensuing description and accompanying drawings.

SUMMARY OF THE INVENTION

The present invention provides a method of storing video images {F[i]} as pages {S[i]} in a holographic storage medium. A video image F[k] is identified as a basis image and stored by recording a basis page S[k] in the medium. A subsequent image F[k+n] is stored by recording in the medium a page $S[k+n]=F[k+n]-a[k]F[k]$. Preferably, a[k] is a positive number on the order of 1. More preferably, a[k] is substantially equal to 1.

In one embodiment, the subtraction operation need not be coherent, and is performed electronically (pixel by pixel). In a preferred embodiment, the subtraction operation is coherent. Coherent subtraction is understood to mean a subtraction operation that allows recovering an image F'[k+n]=F[k+n] by accessing the medium using a reference wave function R[k+n]+b[k]R[k], where R[k+n] corresponds to S[k+n] and R[k] corresponds to S[k]. Coherent subtraction can be accomplished in several ways.

In one embodiment, a page S'[k+n]=F[k+n] is recorded using a reference wave function R[k+n], and a page S"[k+n]=a[k]F[k] is recorded using a reference wave function R'[k+n]=R[k+n]exp(iπ). The component(s) of the reference wave function R'[k+n] are identical in amplitude, but phase-shifted by π, relative to those of R[k+n]. Then S[k+n] is recorded as $S'[k+n]-S''[k+n]=F[k+n]-a[k]F[k]$, and S[k+n] corresponds to R[k+n].

In another embodiment, a page S'[k+n]=F[k+n] is recorded using a reference wave function R[k+n], and a page S"[k+n]=a[k]F[k]exp(iπ) is recorded using R[k+n]. That is, a phase delay of π is introduced in the signal beam path during the recording of S"[k+n], relative to the recording of S'[k+n]. Then S[k+n] is recorded as $S'[k+n]-S''[k+n]=F[k+n]-a[k]F[k]$, and S[k+n] corresponds to R[k+n].

In yet another embodiment, a digital page S⁺[k+n] is recorded using a reference wave function R[k+n]. The digital page S⁺[k+n] contains a positive part of a page F[k+n]−a[k]F[k]. Consider a digital image comprising a collection of pixels. Denote by p[i,j] the value stored at the jth pixel of the ith page. A positive part of F[k+n]−a[k]F[k] contains values of the pixels p[j] for which the difference p[k+n,j]−a[k]p[k,j] is positive. A digital page S⁻[k+n] comprising a negative part of F[k+n]−a[k]F[k] is then recorded using a reference wave function R[k+n]exp(iπ). The page S[k+n] is thus recorded as $S^+[k+n]+S^-[k+n]=F[k+n]-a[k]F[k]$, and S[k+n] corresponds to R[k+n].

In still another embodiment, a page F[k+n]−a[k]F[k] generated by coherent subtraction is directly encoded into a signal beam through the use of a compound phase-and-amplitude spatial light modulator. That is, S[k] and S[k+n] specify amplitude and phase modulations imparted on reference beams, rather than amplitude-only modulations as in conventional recording. The phase modulation is used to specify the sign of the difference between a value of a component p[k+n,j] of F[k+n] and a value of a component a[k]p[k,j] of a[k]F[k]. In one embodiment, the negative-difference components are phase-delayed by π relative to the positive-difference components.

In a preferred embodiment, the reference wave function R[k] specifies a phase modulation imparted on a reference beam. In general, however, the important requirement in a method of the present of the invention is that R[k] be substantially orthogonal to R[k+n]. In an embodiment, R[k] and R[k+n] specify amplitude and phase modulations. In another embodiment, R[k] specifies an angle between a reference beam and the storage medium.

In a preferred embodiment, the basis image is reset whenever there is a substantial difference between an image to be stored and the current basis image. An average intensity I[k] of an image $G[k]=F[k]-a[k-m]F[k-m]$ is determined, where F[k-m] is an original or current basis page. If I[k] exceeds a predetermined threshold T, F[k] is identified as a new basis image and is stored as a page S[k]=F[k]. If I[k] is below T, F[k] is stored as a page $S[k]=F[k]-a[k-m]F[k-m]$.

Preferably, the similarity verification process described above is repeated for F[k+n]. An average intensity I[k+n] of an image $G[k+n]=F[k+n]-a[k]F[k]$ is determined, and F[k+n] is stored as a page $S[k+n]=F[k+n]-a[k]F[k]$ if I[k+n] is less than T, and as a page S[k+n]=F[k+n] if I[k+n] exceeds T.

A basis page is preferably marked by a basis signal comprising a part of a page S[k-q], where q is any integer. A basis signal contains a predetermined set of data. In one embodiment, a basis signal comprises a blank or checkerboard-patterned section of a page. In a preferred embodiment, the basis signal comprises an entire page preceding a basis page. In this embodiment, q=1 and the basis signal is the page S[k-1] itself.

In a preferred embodiment, multiple pages are stored with reference to a common basis page. That is, an image F[k+n+p] is stored as a page $S[k+n+p]=F[k+n+p]-a[k]F[k]$.

In another embodiment, each page is stored with reference to its predecessor. In this embodiment an image F[k+n+1] is stored as a page $S[k+n+1]=F[k+n+1]-a[k+n]F[k+n]$. Differential encoding between consecutive pages is useful in circumstances in which the accumulation of noise from one page to the next is minimal.

A basis image F'[k] is retrieved by reading a basis page S[k] and assigning F'[k]=S[k]. Subsequent images are retrieved as $F'[k+n]=S[k+n]+b[k]S[k]$, where b[k]≠0, and preferably b[k]=a[k]=1. Since time constraints are crucial during decoding, the step of retrieving F'[k+n] preferably comprises a coherent addition of S[k+n] and b[k]S[k]. The addition is achieved by accessing the medium using a reference wave function R[k+n]+b[k]R[k].

If multiple pages are stored with reference to a common basis page, a page F[k+n+p] originally stored as a page $S[k+n+p]=F[k+n+p]-a[k]F[k]$ is retrieved by reading S[k+n+p] and assigning $F'[k+n+p]=S[k+n+p]+b[k]S[k]$, where b[k]=a[k].

If each page is stored with reference to its predecessor, an image F[k+n+1] originally stored as a page $S[k+n+1]=F[k+n+1]-a[k+n]F[k+n]$ is retrieved by reading S[k+n+1] and assigning $$F'[k+n+1] = \sum_{j=0}^{n+1} b[k+j]S[k+j], \quad [1]$$

where the coefficients b[k+j] are chosen such that F'[k+n]=F[k+n], i.e.

$$b[k+j] = \prod_{i=k}^{k+n-j} a[i]. \quad [2]$$

Preferably, b[k]=a[k]=1 for all k.

The present invention further provides a video image storage apparatus comprising a storage identification means for identifying an image F[k] as a basis image, and a storage means for recording a page S[k]=F[k] and a page $S[k+n]=F[k+n]-a[k]F[k]$, where a[k]≠0 and preferably a[k]=1. The storage means comprises multiplexing means such as a phase-code, phase-and-amplitude-code, angular multiplexing means, or other monochromatic multiplexing means.

Preferably, the multiplexing means comprises a phase spatial light-modulator for recording S[k] using a phase reference wave function R[k], and for recording S[k+n] using a phase reference wave function R[k+n] such that R[k+n] is orthogonal to R[k]. In one embodiment, the multiplexing means comprises compound phase-and-amplitude modulating means placed in the reference beam path. In another embodiment, the multiplexing means comprises angular multiplexing means for changing the orientation of the reference beam relative to the signal beam and/or the storage medium.

Depending on the method used for the coherent subtraction of data pages, the storage apparatus further comprises either an amplitude spatial light modulator, or a compounds phase-and-amplitude spatial light modulator placed in the signal beam. path.

Data is retrieved using a video image retrieval apparatus comprising a retrieval identification means for identifying a page S[k] as a basis page, and a retrieval means for retrieving a basis image F'[k]=S[k] and an image $F'[k+n]=S[k+n]+b[k]S[k]$, wherein b[k]≠0. The retrieval identification means comprises either a table of basis pages, or a means for determining an average intensities of S[k] and S[k+n].

The apparatus preferably comprises a multiplexing means for reading S[k] using R[k] and reading S[k+n] using R[k+n]+b[k]R[k]. In one embodiment, the multiplexing means in the retrieval apparatus is identical to the multiplexing means in the storage apparatus used to store S[k] and S[k+n].

In an angle-multiplexed system, the readout multiplexing means comprises a simultaneous angular multiplexing means for simultaneously accessing the medium with two reference beam at different angles, one beam corresponding to R[k+n], and the other to b[k]R[k].

A video compression method of the present invention leads to a reduction in interpage crosstalk. In addition, the use of optical page-by-page addition for retrieval allows fast readout and eliminates the need for a time-consuming electronic decompression step.

DESCRIPTION OF THE FIGURES

FIG. 1-A shows a schematic perspective view of a setup for phase-code mutiplexing images in a holographic storage medium, according to the present invention.

FIG. 1-B is a schematic diagram of a system similar to that shown in FIG. 1-A.

FIG. 2-A shows two pixels of a PSLM having different associated phase delays, used for the storage of an image.

FIG. 2-B shows two pixels of a PSLM having identical associated phase delays.

FIGS. 3A–3H shows eight one-dimensional Walsh functions and their pixel correspondents, according to the present invention.

FIG. 4 shows six rows of pixels corresponding to a wave function $W_m$, where adjacent rows are separated by a distance d, according to the present invention.

FIG. 5-A illustrates the presence of Bragg selectivity in the horizontal direction, according to the present invention.

FIG. 5-B illustrates the absence of Bragg selectivity between adjacent codes in the vertical direction, according to the present invention.

FIG. 6-A shows two binary images and their coherent (phase and amplitude) difference, according to the present invention.

FIG. 6-B shows two gray-scale images and their coherent (phase and amplitude) difference, according to the present invention.

FIG. 6-C shows digital pages that comprise positive and negative parts of a binary digital image.

FIG. 7-A is a simplified flowchart showing the encoding steps in a preferred embodiment of the present invention.

FIG. 7-B shows the correspondence between images and recorded pages for a sequence of images, according to a method of the present invention.

FIG. 8 shows two Walsh functions and their sum, according to the present invention.

FIG. 9 is a simplified flowchart showing decoding steps in a preferred embodiment of the present invention.

FIG. 10-A shows two binary images and their electronic (amplitude only) difference, according to the present invention.

FIG. 10-B shows two gray-scale images and their electronic (amplitude only) difference, according to the present invention.

DETAILED DESCRIPTION

In the following discussion, for some quantity A, the notation A[i] is understood to correspond to some (fixed) i, while the notation {A[i]} is understood to refer to a set of A[i] for varying values of i. The notation S[i] is understood to refer to a wave function of a signal beam, or, equivalently, to a modulation imparted on a signal beam by a spatial light modulating means. The notation R[i] refers to a wave function/modulation of a reference beam.

The statement that an image F[i] is stored in a medium is understood to mean that a corresponding page S[i] is recorded in the medium. The page S[i] contains information that is necessary, but that need not be sufficient, for the recovery of F[i]. That is, in general S[i] need not be identical to F[i]. The statement that a page S[i] is read is understood to imply that the medium is accessed with a reference wave function that is not orthogonal to R[i], where R[i] is the wave function used for the recording of S[i]. The statement that a page S[i] corresponds to a reference wave function R[i] is understood to mean that accessing the medium with R[i] results in a reconstruction of S[i].

A method of the present invention is particularly suited for the holographic storage of video images, i.e. images having some degree of interimage similarity or correlation. Video images include real images and transforms of real images, such as for example JPEG or other linear or non-linear transforms of real images. In particular, video images include real images having a moving foreground and a substantially constant background. Eliminating the redundant storing of the background in consecutive frames leads to a reduction in the average intensity of the stored pages, and consequently to increased capacity in a crosstalk-limited storage system.

The following discussion will address first multiplexed holography, and thereafter electronic (non-coherent) and coherent coding and decoding of video images in holographic media.

Multiplexed Holography

In a typical volume holographic storage system data is stored in a photosensitive storage medium. Storage materials investigated so far include photorefractive crystals, doped glasses, photorefractive polymers, photopolymers, and bacteriorhodopsin. Suitable holographic storage media are generally known in the art. Media comprising photorefractive crystals, such as lithium niobate ($LiNbO_3$) or strontium barium niobate (SBN), have proved to be particularly useful for holographic storage.

Several approaches have been used for multiplexing, or storing of multiple pages in a medium. Common approaches include spatial, wavelength, angular, and phase-code multiplexing. In a method using electronic subtraction/addition of data pages, any multiplexing approach is suitable. For a method employing coherent subtraction and addition of data pages, phase-code and angular multiplexing are suitable approaches. Since phase-code recording and phase-and-amplitude readout are the preferred approaches for coherent subtraction/addition, and can also be used with electronic subtraction/addition, the following discussion will focus on phase-code and phase-and-amplitude-code multiplexing. As is apparent to the skilled artisan, however, the present invention can used with other multiplexing approaches, and in particular with angular multiplexing.

Phase Code Multiplexing

Orthogonal phase code multiplexing offers a number of advantages over angular and wavelength multiplexing, including the possibility of implementation with fixed geometry and wavelength, and the possibility of performing linear operations on the stored data by modulating the reference beam. For further information on orthogonal phase-code multiplexing, see for example U.S. Pat. No. 3,612,641, or articles by Denz et al. in Opt. Comm. 85: 171 (1991), Taketomi et al. in Opt. Lett. 16: 1774 (1991), and Taketomi et al. in 1991 OSA Topical Meeting on Photorefractive Materials, Effects, and Devices, Beverly, Mass., p. 126 (1991).

FIG. 1-A is a schematic perspective view of a holographic storage system suitable for phase-code multiplexing. Information is recorded in a recording medium 20 as an interference pattern produced by a reference beam 22 and a signal beam 24. The interference pattern (grating) corresponding to a data page is stored throughout medium 20. For readout, only the reference beam is sent through the medium, and the interaction of the reference beam with the stored grating yields a reconstruction of the stored data.

A coherent light source such as a laser 26 generates a beam that is split by a beam splitter 28 into reference beam 22 and signal beam 24. Beams 22 and 24 pass through the lenses 30 and the spatial light modulators (SLMs) 38, 40, and are reflected by the mirrors 44. Ways of arranging lenses and mirrors for spatially manipulating and transforming beams are well known in the art. In angle- and phase-code-multiplexed systems, reference beam 22 is preferably perpendicular to signal beam 24 within holographic medium 20, so as to minimize crosstalk due to Bragg-mismatched reconstruction. In wavelength multiplexed systems, an arrangement in which reference beam 22 is counter propagating with signal beam 24 within medium 20 yields a maximal wavelength selectivity.

If, as in a preferred embodiment, both phase and amplitude information is encoded in the signal beam, SLM 38 is a compound phase-and-amplitude spatial light modulator (PASLM). Similarly, in a preferred embodiment SLM 40 is a PASLM. If, as in a conventional phase-code-multiplexed storage system, only amplitude information is encoded in the signal beam and only phase information is encoded in the reference beam, SLM 38 is an amplitude spatial light modulator (ASLM) and SLM 40 is a phase spatial light modulator (PSLM).

In a preferred embodiment, medium 20, lenses 30, and SLMs 38, 40 are placed in a Fourier arrangement. If the pixels of SLMs 38, 40 are approximated as point sources, such a placement effectively Fourier transforms the pixels of SLMs 38, 40 into plane wave components. As is apparent to the skilled artisan, however, a Fresnel (i.e. non-Fourier) arrangement is also suitable for holographic storage.

FIG. 1-B is a more detailed view of a Fourier system similar to that in FIG. 1-A, showing beam expanders 46 and a camera 48. Camera 48 reads out reconstructed data pages. In the embodiment shown in FIG. 1-B, reference beam 22 is modulated by an ASLM 50 and a PSLM 52, while signal beam 24 is modulated by an ASLM 54 and a PSLM 56.

In a preferred embodiment, the reference wave functions are two-level (0–$\pi$) functions. Multi-level phase functions are also suitable in a method of the present invention, however, as long as the reference wave functions are orthogonal. An intuitive understanding of phase-code multiplexing can be achieved with reference to the two-element, two-level phase functions illustrated in FIGS. 2-A and 2-B. Each element of a phase function corresponds to a pixel $p_1$ or $p_2$ of SLM 38. The pixels $p_1$ and $p_2$ alter the phase of light passing though them. The hatching in FIG. 2-A refers to the phase, not amplitude, modulation imparted by the pixels. In FIG. 2-A, the phase of light passing through $p^{(A)}_1$ is unaltered, while the phase of light passing through $p^{(A)}_2$ is modified by $\pi$. In FIG. 2-B, the phase of light passing through $p^{(B)}_1$ and $p^{(B)}_2$ is unaltered.

Consider a page S stored with the phase function shown in FIG. 2-A. Accessing the recording medium with the same phase function results in a reconstruction of S. The signal component reconstructed using $p^{(A)}_1$ interferes constructively with the signal component reconstructed using $p^{(A)}_2$. The constructive interference of the signal components results in the reconstruction of S at the detector. Accessing the medium with the phase function shown in FIG. 2-B, however, will result in a zero net signal, since the signal reconstructed using $p^{(B)}_2$ will be out of phase with the signal reconstructed using $p^{(B)}_1$. The net output signal is therefore zero. A second page S' is then stored using the phase function in FIG. 2-B. Accessing the recording medium with the phase function in FIG. 2-A results in a reconstruction of S, while accessing the medium with the phase function in FIG. 2-B results in a reconstruction of S'.

Two-level orthogonal phase code multiplexing is an extension of the above example to a set of orthogonal phase functions having N elements. If any two functions in the orthogonal set are compared, half the elements will be different and half the elements will be the same between the two functions. Suppose an image is stored using one of the N-element phase functions. If readout is performed with a different (orthogonal) N-element phase function, the signals reconstructed with the N/2 elements that are the same as in the original function will interfere destructively with the signals reconstructed with the N/2 elements that are different. Thus, accessing the medium with any function orthogonal to the function used to store a given image will not result in the reconstruction of that image.

In a preferred embodiment, the orthogonal functions used for multiplexing are Walsh functions. For more information on Walsh functions, see for example K. G. Beauchamp, *Applications of Walsh and Related Functions,* Academic Press, London, 1984. The application of orthogonal Walsh functions to phase-code multiplexed holographic storage is also described in the above-mentioned U.S. Pat. No. 3,612, 641.

Sets of N-element Walsh functions can be constructed for arbitrary values of N. Constructing sets of Walsh functions is well known in the art, and can be done for example by linearly combining Rademacher functions $\text{sign}[\sin(2^n\pi x)]$. FIGS. 3A–3H shows eight one-dimensional Walsh functions, and corresponding pixel representations, where pixel colors refers to phase (not amplitude) modulations. In general, there are N distinct orthogonal functions in a set of N-element Walsh functions. For two arbitrary different functions in a set, exactly N/2 pixels are identical in the two functions, and exactly N/2 pixels are different between the two functions.

In a preferred embodiment, the multiplexing functions are one-dimensional Walsh functions, rather than two-dimensional ones.

That is, the wave function corresponds to rows of pixels, rather than to a two-dimensional array of pixels. FIG. 4 shows several rows of pixels separated by a distance d. Preferably, the set of rows in a page of PSLM 38 comprises a Walsh function. It is also possible for each row to represent a Walsh function. The crucial requirement, for crosstalk purposes, is only that the functions {R[j]} be orthogonal.

For clarity, in the following discussion the plane defined by the reference beam and the signal beam is understood to be the horizontal plane. The preference for a one-dimensional reference wave function is due to the fact that in phase-code multiplexed systems, there is Bragg selectivity in the horizontal, but not vertical direction, as illustrated below.

Consider two pixels p and p', adjacent on a row of PSLM 40. If the pixels are approximated as points, the reference beam will have a plane wave component with a wave vector $\rho$ corresponding to p, and a plane wave component with a wave vector $\rho'$ corresponding to p'. Consider a signal beam having plane wave components with wave vectors denoted collectively $\sigma$, where it is understood that the orientations of $\sigma$ span a range, as shown in the k-space diagrams of FIG. 5-A. For simplicity, the orientations of $\sigma$ are shown to vary only within the horizontal plane. FIG. 5-A also shows grating vectors collectively denoted K, recorded by the interference of the signal beam and the part of the reference beam corresponding to pixel p. A second set of grating vectors K' is recorded by the interference of the signal beam and the part of the reference beam corresponding to pixel p'. Note that the gratings corresponding to p and p' are recorded in distinct, non-overlapping regions in k-space.

Consider now two closely-spaced pixels p and p", adjacent on a column of PSLM 40. Consider a signal beam having plane wave components $\sigma$ whose orientations span ranges in the horizontal and vertical directions, as shown in the k-space diagrams of FIG. 5-B. The grating K corresponding to p is recorded in a region of k-space overlapping with that used to record the grating K" corresponding to p". That is, if a page S is stored using only pixel p, recall using pixel p" will result in a reconstruction of S.

Therefore, it is preferred that the distance d between adjacent rows of pixels on PSLM 40 be large enough so that the angular separation between adjacent rows is at least as large as the vertical angular bandwidth of the signal beam. Gratings corresponding to adjacent rows are then reconstructed in non-overlapping regions of the output plane.

Angular and Other Multiplexing Approaches

Angular and wavelength multiplexing are suitable multiplexing approaches for an electronic compression method of the present invention, while angular multiplexing is also suitable for a coherent compression method. A storage system in an angle- or wavelength-multiplexed system is similar to those in FIGS. 1-A and 1-B, with the correction that no SLM is needed in the reference beam path. The multiplexing function of SLM 40 is achieved by e.g. acousto-optical modulator(s), precision rotation stage(s), liquid crystal deflector(s), micromirror(s), electro-optic deflector(s), or other beam deflection means in angular multiplexing, and by tunable light source(s) or external cavity/cavities in wavelength multiplexing. For an electronic (non-coherent) compression method, a conventional geometry using a single reference beam turned on at any one time is suitable for storage and retrieval. For a coherent compression method in an angle-multiplexed system, the storage system is preferably capable of simultaneously accessing medium 20 with at least two reference beams during decoding.

Theory and Notation

A data page S[j] is encoded in signal beam 24 by ASLM/PASLM 38, which selectively modulates the amplitude and/or phase of light incident on its pixels. The page S[j] can be thought to be a two-dimensional function specifying the amplitude and phase modulation imparted on the signal beam by the SLM. A page S[j] having N pixels can be represented as a vector $$|S[j]\rangle = |s_1[j]\exp(i\phi_1[j]), \ldots ; s_N[j]\exp(i\phi_N[j])\rangle, \quad [3]$$

where $s_n[j]$ and $\phi_n[j]$ are the amplitude and phase, respectively, of the modulation imparted on the signal beam by the nth pixel of SLM 38 during the storage of the jth page. Typical values of N are on the order of $10^6$, although techniques allowing an increase in page size by several orders of magnitude beyond $10^6$ are under development. Note that there is no immediate fundamental limitation on page size.

Equivalently, S[j] can be thought to be a wave function representing the encoded signal beam within the recording medium. The page S[j] can then be represented as a vector in any suitable base. In particular, it is useful to represent a page as a sum of components corresponding to pixels of SLM 38. That is, the complex value of a page is $$S[j](x) = \sum_{n=1}^{N} s_n[j]\rho_n(x,y,z)\exp(i\phi_n[j]), \quad [4]$$

where $\rho_n(x,y,z)$ represents a transform of the nth pixel within the storage medium, and $\phi_n[j]$ is the phase delay imparted on the nth pixel during the encoding of the jth page.

For a Fourier arrangement, equation [4] becomes $$S[j](x) = \sum_{n=1}^{N} s_n[j]\exp(i(k_n \cdot x - \omega t + \phi_n[j])]. \quad [5]$$

In a Fourier arrangement, each pixel of SLM 38 corresponds approximately to a plane wave within medium 20. The representations of equations [3] and [5] are then equivalent, with the convention that, for a vector $|A[j]\rangle$, $$\langle x|A[j]\rangle = A[j](x) = \sum_{n=1}^{N} a_n[j]\exp(ik_n \cdot x). \quad [6]$$

A reference beam used for the storage of a page S[j] can be represented by a reference wave function R[j]. For phase or phase-and-amplitude coded multiplexing, R[j] specifies a phase and/or amplitude modulation imparted on reference beam 22 by SLM 40. Equivalently, R[j] can be thought to represent the modulated reference beam 22 within medium 20. A notations analogous to that in equation [4] can be used to represent R[j]

$$R[j](x) = \sum_{m=1}^{M} r_m[j]\rho'_m(x,y,z)\exp(i\phi'_m[j]), \quad [7]$$

where it is preferred that $r_m[j]=1$ for all m, i.e. that R[j] specify a phase (but not amplitude) modulation. For angular multiplexing, R[j] is represented by a single term from the sum in equation [7]. In this case, R[j] indirectly specifies an angle between reference beam 22 and signal beam 24.

The present invention allows electronic (non-coherent) and coherent video image compression. For electronic compression, the difference between two bits is determined electronically, and only amplitudes of pixels corresponding to the bits are used. For coherent compression, the difference between two bits is taken to be the vectorial (coherent) difference of signal beam components corresponding to the two bits.

Electronic encoding and decoding are generally time consuming. While encoding need not necessarily be fast, decoding is in most cases sensitive to time constraints. Many applications, such as motion picture playback, require real time decoding of large data amounts. Recently, hardware decompression cards have become available for increasing decoding speed. Time constraints imposed by the requirement of real time decoding remain important in the design of video image memories, however.

As compared to electronic compression, coherent compression allows a significant reduction in decoding time. Coherent compression is therefore preferred inma method of the present invention. The following discussion will focus on coherent compression, and will treat electronic compression only briefly.

Coherent Compression

A method using coherent encoding and decoding uses the observation that it is possible to recall arbitrary linear combinations of phase-code- or angle-multiplexed data pages by using suitably-modulated reference beams. For a detailed description of optical linear combinations of data, see the article by Heanue et al. in *Optics Lett.* 19 (14): 1079–1081 (1994), herein incorporated by reference.

In a phase-code-multiplexed system, the output signal when a reference wave function $|R[p]\rangle$ is used to access a medium containing pages $\{|S[m]\rangle\}$ corresponding to reference wave functions $\{|R[m]\rangle\}$ is:

$$|S_{out}\rangle = \sum_{m=1}^{M} \langle R[m]|\hat{B}^m|R[p]\rangle|S[m]\rangle \quad [8]$$

where the matrix $\hat{B}^m$ is described in the above-incorporated article by Heanue et al. in *Opt. Lett.* 19(14): 1079–1081 (1994).

If Bragg-mismatched reconstruction and spatial frequency dispersion are negligible, and all gratings are recorded to the same strength, the matrix $\hat{B}^m$ is equal to a constant $B_o$ times the identity matrix, and the output signal becomes $$|S[m]_{out}\rangle = B_0 \sum_{m=1}^{M} \langle R[m]|R[p]\rangle|S[m]\rangle. \quad [9]$$

The reference wave functions can be chosen to be orthonormal, i.e. such that $\langle R[i]|R[j]\rangle = \delta_{ij}$, where $\delta_{ij}$ is the Kronecker delta function. For example, the phases of the reference beam components can be modulated according to Walsh functions.

From equation [9] it is clear that, for orthogonal reference beams, an arbitrary linear combination of a number of stored images can be retrieved by addressing the recording medium with the corresponding linear combination of reference beams. That is, if images {S[i]} are stored with orthogonal reference beams {R[i]}, addressing the recording medium with the reference wave functions $\Sigma a[i]R[i]$ will yield the signal $B_o \Sigma a[i]S[i]$, where {a[i]} are arbitrary coefficients.

Note that, if orthogonal reference beams are used, there is a unique decomposition of any linear combination of reference beams into basis reference beams of the orthogonal set. That is, the sum of two reference beams corresponds uniquely to the sum of the images stored with the reference beams, and not to any other linear combination of images.

The coherent addition of pages by illumination of holographic medium 20 with a sum of corresponding reference wave functions essentially replaces the electronic addition of N-pixel pages with the electronic addition M-component reference wave functions, if the sum of reference wave functions is computed during readout, rather than retrieved from storage. Since M can be chosen to be much smaller than N, the replacement of page addition with reference wave function addition leads to a reduction in the time required for readout. In a phase-code multiplexed system, M is preferably on the order of the number of pages stored ($\sim 10^3$–$10^4$ in current systems, but larger values of M are achievable). In a system using angular multiplexing, M=1. Thus, a preferred method of the present invention leads not only to an increase in the capacity of intensity-crosstalk-limited systems, but also to a reduction in readout time as compared to electronic compression methods, such as methods based on motion compensation.

The present invention provides a method of storing video images {F[i]} as pages {S[i]} in a holographic storage medium. A video image F[k] is identified as a basis image and stored by recording a basis page S[k] in the medium. A subsequent image F[k+n] is stored by recording in the medium a page $S[k+n]=F[k+n]-a[k]F[k]$. Preferably, a[k] is a positive number on the order of 1. More preferably, a[k] is substantially equal to 1.

In a preferred embodiment, the subtraction operation is coherent. That is, signal beam wave functions are subtracted vectorially. Coherent subtraction allows recovering an image F'[k+n]=F[k+n] by accessing the medium using a reference wave function R[k+n]+b[k]R[k], where R[k+n] corresponds to S[k+n] and R[k] corresponds to S[k].

Preferably, b[k]=a[k]=1. Therefore, for simplicity, the following figures will illustrate page addition and subtraction for b[k]=a[k]=1. FIG. 6-A illustrates coherent subtraction of binary digital images, while FIG. 6-B illustrates coherent subtraction of gray-scale digital images. As shown in FIGS. 6-A and 6-B, a page S[k+n] containing phase and amplitude information results from the coherent subtraction of an amplitude-only image F[k] from another amplitude-only image F[k+n].

The dark pixels in FIG. 6-A correspond to binary zeros (no light transmission), while the light pixels correspond to binary ones (full light transmission). The phase delay corresponding to each pixel is shown within the pixels of S[k+n], and is zero for the pixels of F[k+n] and F[k]. Each pixel corresponds to a component in the sum of Eq. [4]. FIG. 6-B illustrates coherent subtraction for 3-level gray-scale pages.

Coherent subtraction can be accomplished in several ways. In one embodiment, a page S'[k+n]=F[k+n] is recorded using a reference wave function R[k+n], and a page S"[k+n]=a[k]F[k] is recorded using a reference wave function R'[k+n]=R[k+n]exp(i$\pi$). The component(s) of the reference wave function R'[k+n] are identical in amplitude, but phase-shifted by $\pi$, relative to those of R[k+n]. Then S[k+n] is recorded as $S'[k+n]-S''[k+n]=F[k+n]-a[k]F[k]$, and S[k+n] corresponds to R[k+n].

In another embodiment, a page S'[k+n]=F[k+n] is recorded using a reference wave function R[k+n], and a page S"[k+n]=a[k]F[k]exp(i$\pi$) is recorded using R[k+n]. That is, a phase delay of $\pi$ is introduced in the signal beam path during the recording of S"[k+n], relative to the recording of S'[k+n]. Then S[k+n] is recorded as $S'[k+n]-S''[k+n]=F[k+n]-a[k]F[k]$, and S[k+n] corresponds to R[k+n].

In yet another embodiment, a digital page S$^+$[k+n] is recorded using a reference wave function R[k+n]. The page S$^+$[k+n] contains a positive part of an image F[k+n]-a[k]F[k]. A digital page S$^-$[k+n] comprising a negative part of F[k+n]-a[k]F[k] is then recorded using a reference wave function R[k+n]exp(i$\pi$). FIG. 6-C shows S$^+$[k+n] and S$^-$[k+n] for the images F[k+n] and F[k] shown in FIG. 6-A, and for a[k]=1. Consider a digital image comprising a collection of pixels. Denote by p[i,j] the value stored at the jth pixel of the ith page. A positive part of F[k+n]-a[k]F[k] contains values of the pixels p[j] for which the difference p[k+n,j]-a[k]p[k,j] is positive. The page S[k+n] is thus recorded as $S^+[k+n]+S^-[k+n]=F[k+n]-a[k]F[k]$, and S[k+n] corresponds to R[k+n].

In a preferred embodiment, a page F[k+n]-a[k]F[k] generated by coherent subtraction is directly encoded into a signal beam through the use of a compound phase-and-amplitude spatial light modulator. That is, S[k+n] specifies amplitude and phase modulations imparted on reference beams, as illustrated in FIG. 6-A. The phase modulation is used to specify the sign of the difference between a value of a component p[k+n,j] of F[k+n] and a value of a component a[k]p[k,j] of a[k]F[k]. In one embodiment, the negative-difference components are phase-delayed by $\pi$ relative to the positive-difference components.

In a phase-code-multiplexed system, an important requirement of the invention is that R[k] be substantially orthogonal to R[k+n]. In an angle-multiplexed system, the angular spacings between different pages are chosen so as to minimize interpage crosstalk. Ways of choosing angular interpage spacings are known in the art.

In a preferred embodiment, the basis image is reset whenever there is a substantial difference between an image to be stored and the current basis image. An average intensity I[k] of an image G[k]=F[k]-a[k-m]F[k-m] is determined, where F[k-m] is an original or current basis image. If I[k] exceeds a predetermined threshold T, F[k] is identified as a new basis image and is stored as a page S[k]=F[k]. If I[k] is below T, F[k] is stored as a page $S[k]=F[k]-a[k-m]F[k-m]$.

Preferably, the similarity verification process described above is repeated for F[k+n]. An average intensity I[k+n] of an image G[k+n]=F[k+n]-a[k]F[k] is determined, and F[k+n] is stored as a page $S[k+n]=F[k+n]-a[k]F[k]$ if I[k+n] is less than T, and as a page S[k+n]=F[k+n] if I[k+n] exceeds T.

A basis page is preferably marked by a basis signal comprising a part of a page S[k-q], where q is any integer. A basis signal contains a predetermined set of data. In one embodiment, a basis signal comprises a blank or checkerboard-patterned section of a page. In a preferred embodiment, the basis signal comprises an entire page preceding a basis page. In this embodiment, q=1 and the basis signal is the page S[k-1] itself.

In a preferred embodiment, multiple pages are stored with reference to a common basis page. That is, an image F[k+n+p] is stored as a page $S[k+n+p]=F[k+n+p]-a[k]F[k]$. FIG. 7-A shows a flowchart with some of the steps in such an embodiment, while FIG. 7-B shows the correspondence between images and stored pages for a sequence of six images, where the first and fourth images are identified as reference images.

In another embodiment, each page is stored with reference to its predecessor. In this embodiment an image F[k+n+1] is stored as a page $S[k+n+1]=F[k+n+1]-a[k+n]F[k+n]$. Differential encoding between consecutive pages is useful in circumstances in which the accumulation of noise from one page to the next is minimal.

A basis image F'[k] is retrieved by reading a basis page S[k] and assigning F'[k]=S[k]. Subsequent images are retrieved as $F'[k+n]=S[k+n]+b[k]S[k]$, where b[k]≠0, and preferably b[k]=a[k]=1. Since time constraints are crucial during decoding, the step of retrieving F'[k+n] preferably comprises a coherent addition of S[k+n] and b[k]S[k]. The addition is achieved by accessing the medium using a reference wave function R[k+n]+b[k]R[k]. FIG. 8 illustrates reference wave functions addition for b[k]=1 and for phase-only recording (i.e. for R[k+n] and R[k] set for maximum transmission during recording). The figure shows the pixel representations of two 4-element Walsh functions (see FIGS. 3A–3H) and their sum. The phase and amplitude, respectively, of the modulation imparted by each pixel is given in parentheses.

If multiple pages are stored with reference to a common basis page, a page F[k+n+p] originally stored as a page $S[k+n+p]=F[k+n+p]-a[k]F[k]$ is retrieved by reading S[k+n+p] and assigning $F'[k+n+p]=S[k+n+p]+b[k]S[k]$, where b[k]=a[k]. FIG. 9 is a flowchart illustrating some of the steps in a method using a common basis page for multiple pages.

If each page is stored with reference to its predecessor, an image F[k+n+1] originally stored as a page $S[k+n+1]=F[k+n+1]-a[k+n]F[k+n]$ is retrieved by reading S[k+n+1] and assigning $$F'[n+k+1] = \sum_{j=0}^{n+1} b[k+j]S[k+j], \quad [1]$$

where the coefficients b[k+j] are chosen such that F'[k+n]=F[k+n], i.e.

$$b[k+j] = \prod_{i=k}^{k+n-j} a[i]. \quad [2]$$

Preferably, b[k]=a[k]=1 for all k.

The present invention further provides a video image storage apparatus comprising a storage identification means for identifying an image F[k] as a basis image, and a storage means for recording a page S[k]=F[k] and a page $S[k+n]=F[k+n]-a[k]F[k]$, where a[k]≠0 and preferably a[k]=1. The storage identification means preferably comprises software or hardware for determining the average intensity I[k] of an image $G[k]=F[k]-a[k-m]F[k-m]$. Alternatively, the storage identification means comprises a counter for resetting the reference page for predetermined values of k. The storage means comprises a coherent light source and optical elements for generating and manipulating a signal and a reference beam. The storage means further comprises a means for encoding information into the signal beam, such as a spatial light modulator.

The storage means preferably further comprises multiplexing means such as a phase-code, phase-and-amplitude-code, angular or wavelength multiplexing means. Preferably, the multiplexing means is capable of recording S[k] using a phase reference wave function R[k], and for recording S[k+n] using a phase reference wave function R[k+n] such that R[k+n] is orthogonal to R[k]. For phase code multiplexing, the multiplexing means comprises a spatial light modulating means such as SLM 40 for varying the phases and/or amplitudes of components of reference beam 22 between the storage of different pages. For angular multiplexing, the multiplexing means comprises an acousto-optical modulator or a rotation stage (not shown) instead of SLM 40, for varying the angle between reference beam 22 and signal beam 24. In a angle-multiplexed system in which a phase-and-amplitude page S[k+n] such as the one shown in FIG. 6-A is recorded in a single step, the multiplexing means comprises either multiple light sources, or appropriate optical elements, for illuminating medium 20 simultaneously at two different angles.

Preferably, the storage means comprises a compound phase-and-amplitude modulating means such as a PASLM or a PSLM and an ASLM, placed in the signal beam path. In a preferred phase-code multiplexing embodiment, the storage means further comprises a PASLM in the reference beam path.

Data is retrieved using a video image retrieval apparatus comprising a retrieval identification means for identifying a page S[k] as a basis page, and a retrieval means for retrieving a basis image F'[k]=S[k] and an image $F'[k+n]=S[k+n]+b[k]S[k]$, wherein b[k]≠0. The retrieval identification means comprises either a table of basis pages, or a means for determining average intensities of S[k] and S[k+n]. The retrieval means comprises a coherent light source and optical elements for generating and manipulating a reference beam, and a camera for reading out a reconstructed signal beam.

The retrieval apparatus preferably comprises a multiplexing means for reading S[k] using R[k] and reading S[k+n] using R[k+n]+b[k]R[k]. For phase-code multiplexing, the multiplexing means preferably comprises a PASLM in the reference beam path. For angular multiplexing, the multiplexing means preferably comprises a simultaneous multiplexing means for simultaneously illuminating medium 20 at an angle θ[k+n] corresponding to R[k+n] and at an angle θ[k] corresponding to R[k], with θ[k+n]≠θ[k].

A video compression method of the present invention leads to a reduction in interpage crosstalk. In addition, the use of optical page-by-page addition for retrieval allows fast readout and eliminates the need for a time-consuming electronic decompression step.

Electronic Compression

Electronic differential encoding and decoding does not require phase-modulating the signal beam, and, in a phase-code multiplexed system, amplitude-modulating the reference beam. Electronic decoding is relatively time-consuming, however.

Figure 10:
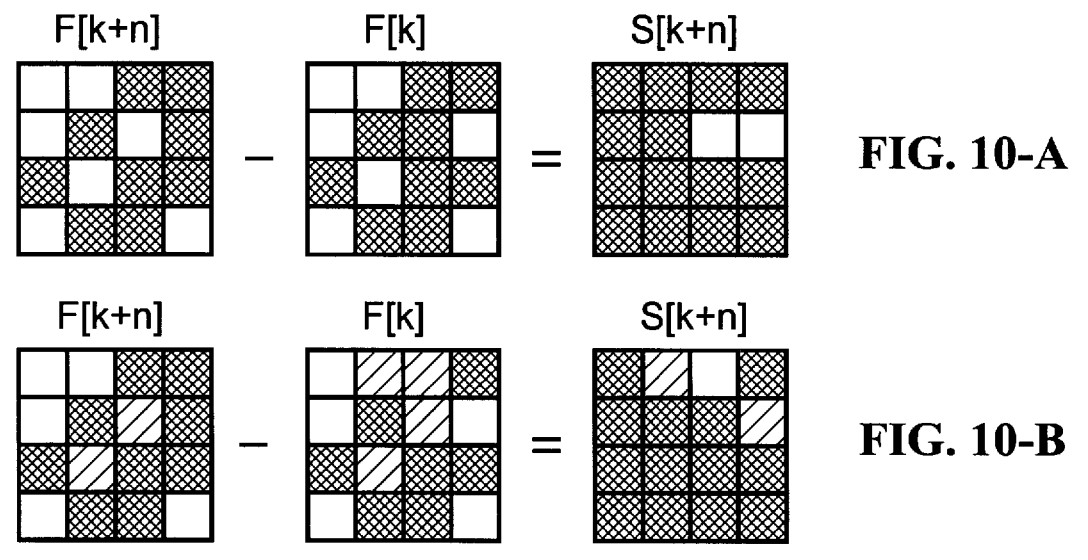

FIG. 10-A shows schematically a binary digital page S[k+n] generated by the subtraction of an image a[k]F[k] from an image F[k+n] for a[k]=1. The images shown in FIG. 10-A are binary digital images having pixels 50. Since a large number of pixels are identical between F[k] and F[k+n], the average intensity of S[k+n] is less than the average intensities of F[k] and F[k+n]. For binary data, differences between bits are given by a predetermined table. For example, the value corresponding to 0−1 can be chosen to be 1; accordingly, during readout the value corresponding to 1+1 is chosen to be 0.

FIG. 10-B illustrates a subtraction operation similar to that shown in FIG. 10-A for digital gray scale images and a[k]=1. For simplicity of presentation, the images shown in FIG. 10-B have only three gray scale levels.

As noted in the definitions of terms at the beginning of the Detailed Description, the images {F[i]} need not be real-life images. In one embodiment, an image F[i] is generated by applying a linear or non-linear transform to a corresponding image H[i]. For example, a Fourier-based transform eliminates intra-frame redundancy in H[i], while a method of the present invention allows further compression by eliminating the interframe redundancy between H[i] and some other (basis) page. For retrieval, the image H[i] is recovered by (inverse) transforming F[i]. The double transformation process may or may not result in some loss of information, depending on the exact transform used.

Conventional video compression methods, such as methods using the JPEG, MPEG or H.261 standards, may be suitable for pre-storage video image compression. For a review of JPEG, see for example W. B. Pennebaker, *JPEG Still Image Compression Standard,* Van Nostrand Reinhold, New York, 1993, while for information on MPEG see for example the article by Le Gall in *Communications of the ACM* 34(4): 37–48. Methods using JPEG achieve intra-frame compression, while methods using MPEG achieve both intra-frame and inter-frame compression.

It will be clear to one skilled in the art that the above embodiment may be altered in many ways without departing from the scope of the invention. For example, a rudimentary form of angle multiplexing can be achieved through the use of a PSLM in the reference beam path, wherein a fraction of the pixels of the PSLM corresponds to an angle; this approach makes poor use of available storage space, however. The pages S[k] and S[k+n] need not necessarily be stored in the same volume, as long the image F'[k+n] is generated by the summation of S[k+n] and b[k]S[k]; in particular, F'[k+n] can be generated by the coherent summation of pages S[k+n] and b[k]S[k] stored in distinct spatial locations. The identity of basis pages can be stored in an alternative memory, or can be predetermined. Stored pages can be analog or digital. In general, any monochromatic multiplexing approach, such as an approach using a combination of angular and phase-code multiplexing, may be suitable for use with the present invention. If a heterodyne interferometric readout means becomes available, wavelength multiplexing will be a suitable multiplexing approach for the present invention. Accordingly, the scope of the invention should be determined by the following claims and their legal equivalents.

What is claimed is:

1. A method of storing a set of video images {F[i]} as a set of video pages {S[i]} in a holographic storage medium, said method comprising the steps of:
   a) setting a threshold intensity T;
   b) selecting a basis image F[k] having an average intensity higher than said threshold intensity T from said set of video images {F[i]};
   c) storing in said medium a basis page S[k] related to said basis image F[k] such that S[k]=F[k];
   d) storing in said medium a page S[k+n] related to an image F[k+n] selected from said set of video images {F[i]} such that $S[k+n]=F[k+n]-a[k]F[k]$, where a[k] is a non-zero coefficient.

2. The method of claim 1 wherein the step of storing said page S[k+n] comprises a coherent subtraction of the product of said basis image F[k] a nd said non-zero coefficient a[k] from said image F[k+n].

3. The method of claim 2 wherein said coherent subtraction comprises:
   a) recording a page S'[k+n]=F[k+n] using a reference wave function R[k+n]; and
   b) recording a page S"[k+n]=a[k]F[k] using a reference wave function R[k+n]exp(iπ),
   whereby $S[k+n]=S'[k+n]-S''[k+n]=F[k+n]-a[k]F[k]$, and S[k+n] corresponds to R[k+n].

4. The method of claim 2 wherein said coherent subtraction comprises:
   a) recording a page S'[k+n]=F[k+n] using a reference wave function R[k+n]; and
   b) recording a page S"[k+n]=[k]F[k] exp(iπ) using a reference wave function R[k+n],
   whereby $S[k+n]=S'[k+n]-S''[k+n]=F[k+n]-a[k]F[k]$, and S[k+n] corresponds to R[k+n].

5. The method of claim 2 wherein said coherent subtraction comprises:
   a) recording a page $S^+[k+n]$ comprising a positive part of F[k+n]-a[k]F[k], using a reference wave function R[k+n]; and
   b) recording a page $S^-[k+n]$ comprising a negative part of F[k+n]-a[k]F[k], using a reference wave function R'[k+n]=R[k+n]exp(iπ);
   whereby $S[k+n]=S^+[k+n]+S^-[k+n]=F[k+n]-a[k]F[k]$, and S[k+n] corresponds to R[k+n].

6. The method of claim 1 wherein said page S[k+n] is modulated by at least one modulation technique selected from the group consisting of phase modulation and amplitude modulation.

7. The method of claim 1 wherein said basis page S[k] corresponds to a reference wave function R[k] specifying at least one modulation of a reference beam, said modulation being selected from the group consisting of phase modulation and amplitude modulation.

8. The method of claim 1 wherein said basis page S[k] corresponds to as reference wave function R[k] specifying a reference beam angle.

9. The method of claim 1 further comprising the step of determining an average intensity I[k+n] of said image F[k+n] and selecting said image F[k+n] as a new basis image if said average intensity I[k+n] exceeds said threshold intensity T.

10. The method of claim 1 further comprising the step of recording a basis signal in said basis page S[k] for identifying said basis page S[k].

11. The method of claim 1 further comprising the step of generating said image F[k+n] by transforming an image H[k+n].

12. The method of claim 1 wherein said coefficient a[k] is substantially equal to 1.

13. A method of retrieving a set of video images {F'[i]} from a set of video pages {S[i]} stored in a holographic storage medium, said method comprising the steps of:
   a) identifying a basis page S[k];
   b) reading said basis page S[k] from said medium to produce a related basis image F'[k] such that F'[k]=S[k];
   c) retrieving an image F'[k+n] from said medium by reading a page S[k+n] and generating said image F'[k+n] according to the relation $F'[k+n]=S[k+n]+b[k]S[k]$, where b[k] is a non-zero coefficient.

14. The method of claim 13 wherein said step of retrieving said image F'[k+n] comprises a coherent addition of the product of said basis page S[k] and said coefficient b[k] to said page S[k+n].

15. The method of claim 14 wherein a reference wave function R[k+n] corresponds to said page S[k+n], a reference wave function R[k] corresponds to said basis page S[k], and said coherent addition comprises retrieving said image F'[k+n] using a reference wave function R[k+n]+b[k]R[k].

16. The method of claim 13 wherein said basis page S[k] corresponds to a rerference wave function R[k] specifyng at least one modulation technique imparted on a reference beam and selected from the group consisting of phase modulation and amplitude modulation.

17. The method of claim 16 wherein said page S[k+n] corresponds to a reference wave function R[k+n] substantially orthogonal to R[k].

18. The method of claim 13 wherein said basis page S[k] corresponds to a reference wave function R[k] specifying a reference beam angle.

19. The method of claim 13 further comprising the step of generating an image H[k+n] by transforming said image F'[k+n].

20. The method of claim 13 wherein said coefficient b[k] is substantially equal to 1.

21. An holographic video image storage apparatus for storing a set of video images {F[i]} as a set of pages {S[i]}, said apparatus comprising:
   a) a holographic storage medium;
   b) a storage identification means for identifying a basis image F[k] from said set of images {F[i]}, said basis image F[k] having a predetermind average intensity higher than a threshold intensity T; and
   c) a storage means for storing said basis image F[k] by recording in said medium a related basis page S[k] such that S[k]=F[k], and for storing an image F[k+n] selected from said set of images {F[i]} in said medium such that $S[k+n]=F[k+n]-a[k]F[k]$, where a[k] is a non-zero coefficient.

22. The storage apparatus of claim 21 wherein said storage means comprises at least one multiplexing means selected from the group of phase multiplexers, amplitude multiplexers and angle multiplexers.

23. The storage apparatus of claim 21 wherein said coefficient a[k] is substantially equal to 1.

24. A holographic video image retrieval apparatus for retrieving a set of video images {F'[i]} from a set of video pages {S[i]}, said apparatus comprising:
   a) a holographic storage medium wherein said set of video pages {S[i]} is stored;
   b) a retrieval identification means for identifying a basis page S[k] from said set of video pages {S[i]};
   c) a retrieval means for reading a basis page S[k] from said medium to produce a related basis image F'[k] such that F'[k]=S[k], and for reading a page S[k+n] and generating said image F'[k+n] according to the relation $F'[k+n]=S[k+n]+b[k]S[k]$, where b[k] is a non-zero coefficient.

25. The retrieval apparatus of claim 24 wherein said basis page S[k] corresponds to a reference wave function R[k], said page S[k+n] corresponds to a reference wave function R[k+n], and said retrieval apparatus further comprises a multiplexing means for reading said basis page S[k] using said reference wave function R[k], and for reading said page S[k+n] using a reference wave function $R[k+n]=R[k+n]+b[k]R[k]$.

26. The retrieval apparatus of claim 25 wherein R[k] is substantially orthogonal to R[k+n].

27. The retrieval apparatus of claim 25 wherein said multiplexing means comprises at least one multiplexer selected from the group consisting of amplitude modulators, phase modulators and angle modulators.

28. The retrieval apparatus of claim 25 wherein said multiplexing means comprises a simultaneous angular multiplexing means for simultaneously accessing said medium with:
   a) a first reference beam corresponding to R[k+n], and characterized by an angle θ[k+n] between said first reference beam and a signal beam; and
   b) a second reference beam corresponding to b[k]R[k] and characterized by an angle θ[k] between said second reference beam and said signal beam, such that θ[k+n]≠θ[k].

29. The retrieval apparatus of claim 24 wherein said coefficient b[k] is substantially equal to 1.

* * * * *